(12) United States Patent
Wang et al.

(10) Patent No.: US 11,296,417 B2
(45) Date of Patent: Apr. 5, 2022

(54) RECONFIGURABLE ANTENNAS AND METHODS OF OPERATING THE SAME

(71) Applicant: Georgia Tech Research Corporation, Atlanta, GA (US)

(72) Inventors: Hua Wang, Marietta, GA (US); Taiyun Chi, Atlanta, GA (US); Jongseok Park, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 500 days.

(21) Appl. No.: 16/068,023

(22) PCT Filed: Jan. 6, 2017

(86) PCT No.: PCT/US2017/012615
§ 371 (c)(1),
(2) Date: Jul. 3, 2018

(87) PCT Pub. No.: WO2017/120528
PCT Pub. Date: Jul. 13, 2017

(65) Prior Publication Data
US 2020/0274242 A1    Aug. 27, 2020

Related U.S. Application Data

(60) Provisional application No. 62/440,868, filed on Dec. 30, 2016, provisional application No. 62/275,928, filed on Jan. 7, 2016.

(51) Int. Cl.
*H01Q 9/04*      (2006.01)
*H01Q 5/321*    (2015.01)
(Continued)

(52) U.S. Cl.
CPC .......... *H01Q 9/0442* (2013.01); *H01P 1/213* (2013.01); *H01Q 5/321* (2015.01); *H01Q 5/35* (2015.01);
(Continued)

(58) Field of Classification Search
None
See application file for complete search history.

(56) References Cited

U.S. PATENT DOCUMENTS 5,087,922 A  *  2/1992  Tang  ................... H01Q 21/062
                                                                343/814
6,239,762 B1 *  5/2001  Lier  ....................... H01Q 13/10
                                                                343/700 MS
(Continued)

OTHER PUBLICATIONS

Ali et al. "A reconfigurable Yagi array for wireless applications" IEEE Antennas and Propagation Society International Symposium 1:1466-468 (Jun. 2002).
(Continued)

*Primary Examiner* — A B Salam Alkassim, Jr.
(74) *Attorney, Agent, or Firm* — Myers Bigel, P.A.

(57) ABSTRACT

Reconfigurable antennas are provided. A reconfigurable antenna includes a plurality of antenna radiators and a plurality of feeds that are electrically or electromagnetically coupled to the plurality of antenna radiators. The plurality of feeds control current or voltage of the plurality of antenna radiators. Related methods of operating a reconfigurable antenna are also provided.

17 Claims, 10 Drawing Sheets

(51) Int. Cl.
  *H01Q 5/35*   (2015.01)
  *H01P 1/213*   (2006.01)
  *H01Q 21/06*   (2006.01)
  *H01Q 21/12*   (2006.01)
  *H03H 7/38*   (2006.01)

(52) U.S. Cl.
  CPC ........... *H01Q 21/062* (2013.01); *H01Q 21/12* (2013.01); *H03H 7/38* (2013.01)

(56) References Cited

U.S. PATENT DOCUMENTS

| | | | | |
|---|---|---|---|---|
| 2002/0102948 | A1* | 8/2002 | Stanwood | H04B 7/2621 455/91 |
| 2003/0098814 | A1 | 5/2003 | Keller et al. | |
| 2007/0146207 | A1* | 6/2007 | Mohamadi | H01Q 23/00 343/700 MS |
| 2007/0205955 | A1 | 9/2007 | Korisch et al. | |
| 2011/0109507 | A1* | 5/2011 | Warnick | H01Q 21/0025 342/368 |
| 2011/0156694 | A1* | 6/2011 | de Graauw | H01Q 21/0075 324/76.51 |
| 2013/0057449 | A1* | 3/2013 | Orihashi | H01Q 9/0435 343/853 |
| 2013/0088383 | A1 | 4/2013 | Forstner et al. | |
| 2013/0241670 | A1* | 9/2013 | Mikhemar | H04B 1/52 333/126 |
| 2014/0029682 | A1 | 1/2014 | Nezhad-Ahmadi et al. | |
| 2015/0015453 | A1 | 1/2015 | Puzella et al. | |
| 2015/0234035 | A1* | 8/2015 | Lohoefener | G01S 13/953 343/702 |
| 2016/0308563 | A1* | 10/2016 | Ouyang | H01Q 1/2283 |
| 2016/0322714 | A1* | 11/2016 | Ying | H01Q 21/30 |
| 2017/0025767 | A1* | 1/2017 | Elsallal | H01Q 3/30 |
| 2017/0062926 | A1* | 3/2017 | Bonebright | H01Q 21/061 |
| 2017/0085006 | A1* | 3/2017 | Corman | H04L 5/1469 |
| 2018/0054005 | A1* | 2/2018 | Jain | H01Q 5/30 |

OTHER PUBLICATIONS

Babakhani et al. "Transmitter Architectures Based on Near-Field Direct Antenna Modulation" IEEE Journal of Solid-State Circuits 43(12):2674-2692 (Dec. 2008).

Chen et al. "Multi-Feed Reconfigurable Pattern Antenna Implemented by Switches" 2005 IEEE Antennas and Propagation Society International Symposium 2A:400-403 (Jul. 2005).

Gupta et al. "Design of frequency-reconfigurable rectangular slot ring antennas" IEEE Antennas and Propagation Society International Symposium 1:326 (Jul. 2000).

Hazen et al. "Stacked reconfigurable antennas for space-based radar applications" Proceedings of the 2001 Antenna Applications Symposium 1:59-69 (Sep. 2001).

Notification of Transmittal of the International Search Report and the Written Opinion of the International Searching Authority, or the Declaration, in corresponding PCT Application No. PCT/US2017/012615 (12 pages) (dated May 15, 2017).

Pringle et al. "A Reconfigurable Aperture Antenna Based on Switched Links Between Electrically Small Metallic Patches" IEEE Transactions on Antennas and Propagation 52(6):1434-1445 (Jun. 2004).

Sanchez et al. "Broadband Antennas Over Electronically Reconfigurable Artificial Magnetic Conductor Surfaces" 2001 Antenna Applications Symposium (14 pages) (Sep. 2001).

Sievenpiper et al. "Electronic beam steering using a varactor-tuned impedance surface" IEEE Antennas and Propagation Society International Symposium 1:174-177 (Jul. 2000).

Extended European Search Report corresponding to European Application No. 17736472.6 (10 pages) (dated Nov. 26, 2018).

De Hoop et al. "Power reciprocity in antenna theory" Proceedings of the Institution of Electrical Engineers 121 (10):1051-1056 (Oct. 1974).

European Examination Report corresponding to European Application No. 17736472.6 (13 pages) (dated Dec. 16, 2020).

* cited by examiner

RECONFIGURABLE ANTENNAS AND METHODS OF OPERATING THE SAME

REFERENCE TO PRIORITY APPLICATIONS

The present application is a 35 U.S.C. § 371 national phase application of PCT Application Ser. No. PCT/US2017/012615, filed Jan. 6, 2017, which claims the benefit of U.S. Provisional Patent Application Ser. No. 62/275,928, filed on Jan. 7, 2016, entitled Reconfigurable Antenna Array with Distributed and Co-Adaptive Multi-Feed Antenna Pixels, the disclosure of which is hereby incorporated herein in its entirety by reference. The present application also claims the benefit of U.S. Provisional Patent Application Ser. No. 62/440,868, filed on Dec. 30, 2016, entitled 60 GHz On-Chip Linear Radiator with Single-Element 27.9 dBm $P_{sat}$ and 33.1 dBm Peak EIRP Using Multi-Feed Antenna for Direct On-Antenna Power Combining, the disclosure of which is hereby incorporated herein in its entirety by reference.

FIELD

The present disclosure generally relates to the field of antennas and, more particularly, to reconfigurable antennas.

BACKGROUND

Antenna arrays may include switches, such as transistors, diodes, or Microelectromechanical systems (MEMS) components, between antenna radiators in the arrays to allow for selection of different subsets of the antenna radiators. For example, *A Reconfigurable Aperture Antenna Based on Switched Links Between Electrically Small Metallic Patches*, by Pringle et al., IEEE TRANSACTIONS ON ANTENNAS AND PROPAGATION, VOL. 52, NO. 6, JUNE 2004, pages 1434-1445, discusses an array of metallic patches that are interconnected by switches. Such switches, however, may result in loss, linearity issues, and power-handling issues. Moreover, the feeding point of such an array may limit antenna bandwidth.

SUMMARY

Various embodiments of the present disclosure may provide an electrically-reconfigurable antenna. The electrically-reconfigurable antenna may include a plurality of antenna elements linked together by a plurality of independently-controllable radio frequency (RF) interface circuits that support impedance (Z) reciprocity during transmit (TX) and receive (RX) modes of operation. In some embodiments, $[Z_{RX}]=[Z_{TX}]^*$, where $Z_{TX}$ designates a transmit driving impedance and $Z_{RX}$ designates a receive termination impedance. The plurality of independently-controllable RF interface circuits may, in some embodiments, be configured to selectively provide: (i) a particular one of a plurality of transmit driving impedances $Z_{TX}$ during the TX mode; and (ii) a particular one of a plurality of receive termination impedances $Z_{RX}$ during the RX mode. The plurality of transmit driving impedances $Z_{TX}$ may provide a matrix of impedance values, at least some of which may be different (i.e., unequal) from each other. Moreover, the plurality of receive termination impedances $Z_{RX}$ may provide a matrix of impedance values, at least some of which may be different from each other.

In various embodiments, the plurality of antenna elements may include N+1 antenna elements and the plurality of RF interface circuits may include N pairs of duplexers, where N is a positive integer greater than one. Alternatively, the plurality of antenna elements may include M antenna elements and the plurality of RF interface circuits may include P duplexers, where M and P are positive integers greater than one. A first of the plurality of RF interface circuits may include a first duplexer coupled to a first of the plurality of antenna elements and a second duplexer coupled to a second of the plurality of antenna elements. A second of the plurality of RF interface circuits may include a first duplexer coupled to the second of the plurality of antenna elements and a second duplexer coupled to a third of the plurality of antenna elements. Moreover, the first of the plurality of RF interface circuits may operate as a first RF current feed or voltage driving circuit during the TX mode of operation.

According to various embodiments, the second duplexer in the first of the plurality of RF interface circuits may be coupled to a first end of the second of the plurality of antenna elements and the first duplexer in the second of the plurality of RF interface circuits may be coupled to a second end of the second of the plurality of antenna elements. During the TX mode of operation, the first end of the second of the plurality of antenna elements may be electrically connected to a first parallel LC circuit (with variable C) within the second duplexer. During the RX mode of operation, the first end of the second of the plurality of antenna elements may be electrically connected to a second parallel LC circuit (with variable L) within the second duplexer.

An electrically-reconfigurable antenna, according to various embodiments, may include a plurality of antenna radiators. The electrically-reconfigurable antenna may include a plurality of independently-controllable feed circuits electrically or electromagnetically coupled to respective pairs of the plurality of antenna radiators. At least one of the plurality of antenna radiators may be electrically or electromagnetically coupled to two of the feed circuits.

In various embodiments, the plurality of antenna radiators may include a plurality of rows and a plurality of columns of antenna radiators arranged in a two-dimensional grid. The feed circuits associated with the plurality of rows of antenna radiators may be independently-controllable relative to each other and relative to the feed circuits associated with the plurality of columns of antenna radiators. In some embodiments, each of the plurality of rows (and each of the plurality of columns) of antenna radiators and corresponding feed circuits may be configured to support antenna-level power combining. In some embodiments, each of the feed circuits may be configured to support impedance reciprocity. Moreover, the antenna may include a control circuit that is electrically coupled to the feed circuits, and is configured to control modulation of amplitude and/or phase of radio frequency (RF) currents through each of the feed circuits.

A reconfigurable-antenna device, according to various embodiments, may include a multi-feed antenna including a plurality of antenna radiator segments that are spaced apart from each other. Moreover, the reconfigurable-antenna device may include a plurality of Radio Frequency (RF) feeds, each of which is configured to control current or voltage of at least one of the plurality of antenna radiator segments. At least one of the plurality of antenna radiator segments may be electrically or electromagnetically coupled to two of the RF feeds. In some embodiments, the plurality of antenna radiator segments may be selectable by the plurality of RF feeds without using any switch interconnected between the antenna radiator segments.

In various embodiments, the plurality of RF feeds may include N RF feeds, and the plurality of antenna radiator segments may include N+1 antenna radiator segments. The N+1 antenna radiator segments may, in some embodiments, include at least one row of antenna radiator segments and at least one column of antenna radiator segments. The at least one row and the at least one column may, in some embodiments, include a plurality of rows and a plurality of columns, respectively, of antenna radiator segments. In some embodiments, the plurality of antenna radiator segments may define one electrically-reconfigurable antenna pixel. In some embodiments, the plurality of rows and the plurality of columns may define one electrically-reconfigurable antenna pixel among a plurality of rows and a plurality of columns of electrically-reconfigurable antenna pixels.

In some embodiments, the plurality of RF feeds may include N RF feeds, and the plurality of antenna radiator segments may include M antenna radiator segments. The M antenna radiator segments may include at least one row of antenna radiator segments and at least one column of antenna radiator segments.

According to various embodiments, the plurality of RF feeds may be provided by a plurality of independently-controllable feed circuits, respectively. Each of the plurality of independently-controllable feed circuits may be coupled to a respective pair of adjacent ones of the plurality of antenna radiator segments. Each of the plurality of independently-controllable feed circuits may be configured to control amplitude and/or phase of RF current or voltage. Moreover, each of the plurality of independently-controllable feed circuits may be configured to control a feed impedance of the reconfigurable-antenna device. In some embodiments, one of the plurality of antenna radiator segments may be electrically or electromagnetically coupled to first and second of the plurality of independently-controllable feed circuits.

In various embodiments, each of the plurality of RF feeds may be coupled to two of the plurality of antenna radiator segments. Moreover, the two of the plurality of antenna radiator segments may be free of a direct connection to a transistor, a diode, or a Microelectromechanical systems (MEMS) component therebetween.

A method of operating a reconfigurable-antenna device, according to various embodiments, may include controlling current of a plurality of spaced-apart, antenna radiator segments of a multi-feed antenna by using a plurality of Radio Frequency (RF) feeds that are coupled to respective pairs of the plurality of spaced-apart, antenna radiator segments. At least one of the plurality of spaced-apart, antenna radiator segments may be coupled to two of the RF feeds. In some embodiments, controlling current includes providing a radiation current pattern that is defined by a subset of the plurality of antenna radiator segments by simultaneously driving multiple ones of the plurality of RF feeds to control current or voltage of at least portions of each of first and second ones of a plurality of rows, and at least portions of each of first and second ones of a plurality of columns, of antenna radiator segments.

In various embodiments, the method may include reconfiguring the current pattern by using the plurality of RF feeds to control current or voltage of a different subset of plurality of antenna radiator segments. In some embodiments, the method may include reconfiguring the radiation current pattern by using the plurality of RF feeds to control a terminal current or a terminal voltage of a different subset of the N RF feeds. In some embodiments, reconfiguring includes selectively activating the different subset of the antenna radiator segments by changing the terminal current or the terminal voltage of the N RF feeds.

According to various embodiments, providing the current pattern includes controlling an amplitude and/or phase of respective RF currents in the antenna radiator segments in the subset. Moreover, in some embodiments, the plurality of RF feeds are provided by a plurality of independently-controllable feed circuits, respectively, and the method includes using the feed circuits to control feed impedances of the reconfigurable-antenna device.

In some embodiments, the plurality of RF feeds may include N RF feeds, and the plurality of spaced-apart, antenna radiator segments may include M antenna radiator segments. Controlling current may include providing a radiation current pattern that is defined by a subset of the M antenna radiator segments by simultaneously driving a subset of the N RF feeds.

In some embodiments, the method may include reconfiguring the radiation current pattern by using the plurality of RF feeds to control a terminal current or a terminal voltage of a different subset of the N RF feeds. In some embodiments, reconfiguring may include selectively activating a different subset of the M antenna radiator segments by changing the terminal current or the terminal voltage of the N RF feeds. Moreover, providing the radiation current pattern may include controlling an amplitude and/or phase of respective RF terminal currents or voltages in the M antenna radiator segments in the subset.

Other methods and devices according to embodiments of the present disclosure will be or become apparent to one with skill in the art upon review of the following drawings and detailed description. It is intended that all such additional methods and devices be included within this description, be within the scope of present inventive concepts, and be protected by the accompanying claims. Moreover, it is intended that all embodiments disclosed herein can be implemented separately or combined in any way and/or combination.

DETAILED DESCRIPTION

Various embodiments described herein may provide reconfigurable antennas that use multiple Radio Frequency (RF) feeds to independently control the collective radiation currents of multiple antenna radiation segments, so that the multiple antenna radiation segments operate collectively and exhibit desired radiation characteristics, including radiation pattern, radiation frequency, and/or radiation polarity. By controlling the amplitudes or phases of terminal current or voltage values of the multiple RF feeds, the reconfigurable antennas may increase control of a radiation current pattern provided by a group of the radiation segments, as each radiation segment in the group is independently controlled via its RF feed(s). The multiple antenna radiation segments may be connected (e.g., as one continuous/contiguous element) or disconnected (e.g., spaced apart). For example, multiple feeds may, in some embodiments, be connected to the same continuous/contiguous element (e.g., the same strip of continuous metal).

Figure 1A:
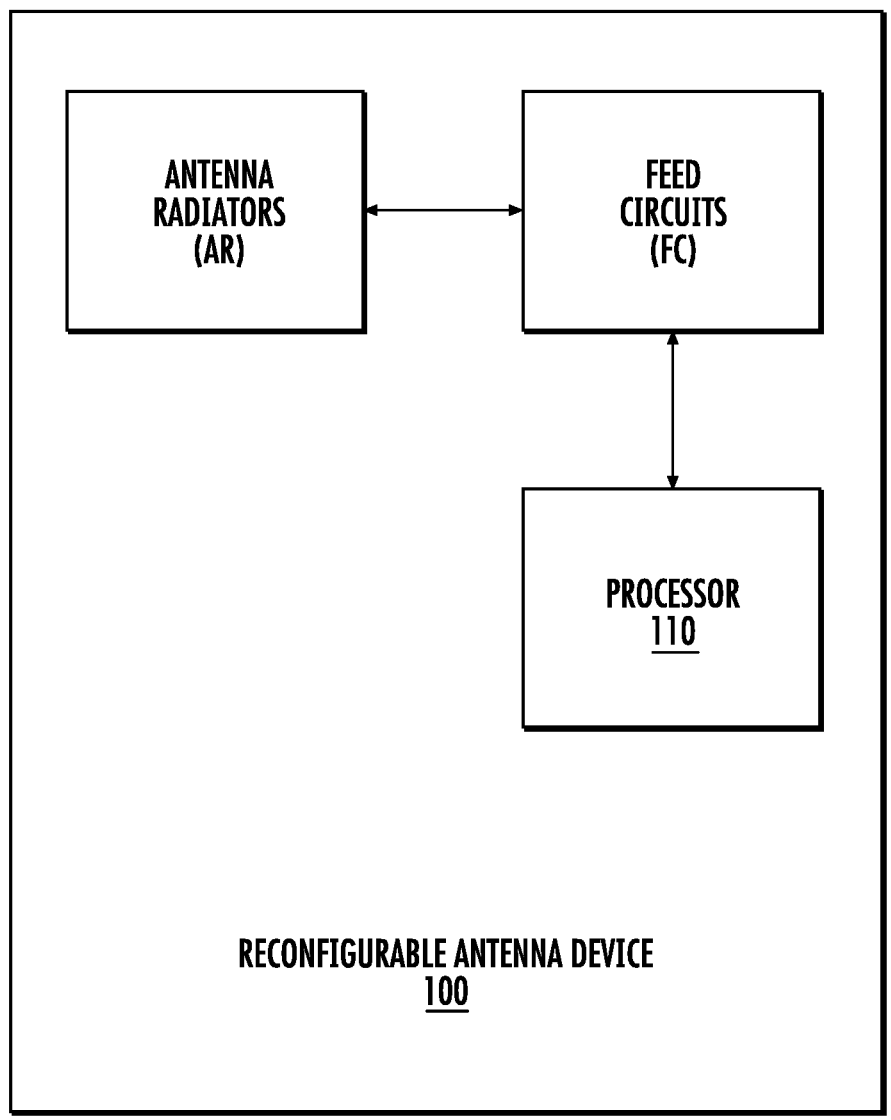
FIG. 1A is a block diagram of a reconfigurable antenna device, according to various embodiments of present inventive concepts.

FIG. 1A is a block diagram of a reconfigurable antenna device 100, according to various embodiments of present inventive concepts. The reconfigurable antenna device 100 includes antenna radiators AR, feed circuits FC coupled to the antenna radiators AR, and a processor 110 coupled to the feed circuits FC. The reconfigurable antenna device 100 may also be referred to herein as a "reconfigurable-antenna device" or an "electrically/electromagnetically-reconfigurable antenna." Because the reconfigurable antenna device 100 includes a plurality of antenna feed circuits FC (which provide a plurality of RF feeds, respectively), the antenna radiators AR that are fed by the plurality of RF feeds are radiators of a multi-feed antenna. The feed circuits FC may include tunable/nontunable passive networks or elements and active circuits such as low noise amplifiers, power amplifiers, driver amplifiers, switches, and mixers.

The feed circuits FC may be coupled to the antenna radiators AR electrically or electromagnetically. Accordingly, the feed circuits FC may have a wired connection to the antenna radiators AR or a wireless (using a field) connection to the antenna radiators AR. The term "electrically-reconfigurable antenna," as used herein, does not limit the couplings between the antenna radiators AR and the feed circuits FC to wired rather than wireless connections. Rather, the term "electrically-reconfigurable antenna" may refer to using the processor 110 to electrically control the feed circuits FC, which then control the antenna radiators AR either electrically or electromagnetically. The processor 110 that is coupled to the feed circuits FC may be, for example, a commercially available or custom microprocessor. The processor 110 may include a control circuit that is electrically coupled to the feed circuits FC. The control circuit may be configured to control modulation of amplitude and/or phase of RF currents through each of the feed circuits FC. In some embodiments, the processor 110 may optionally include multiple processors/control circuits.

Figure 1B:
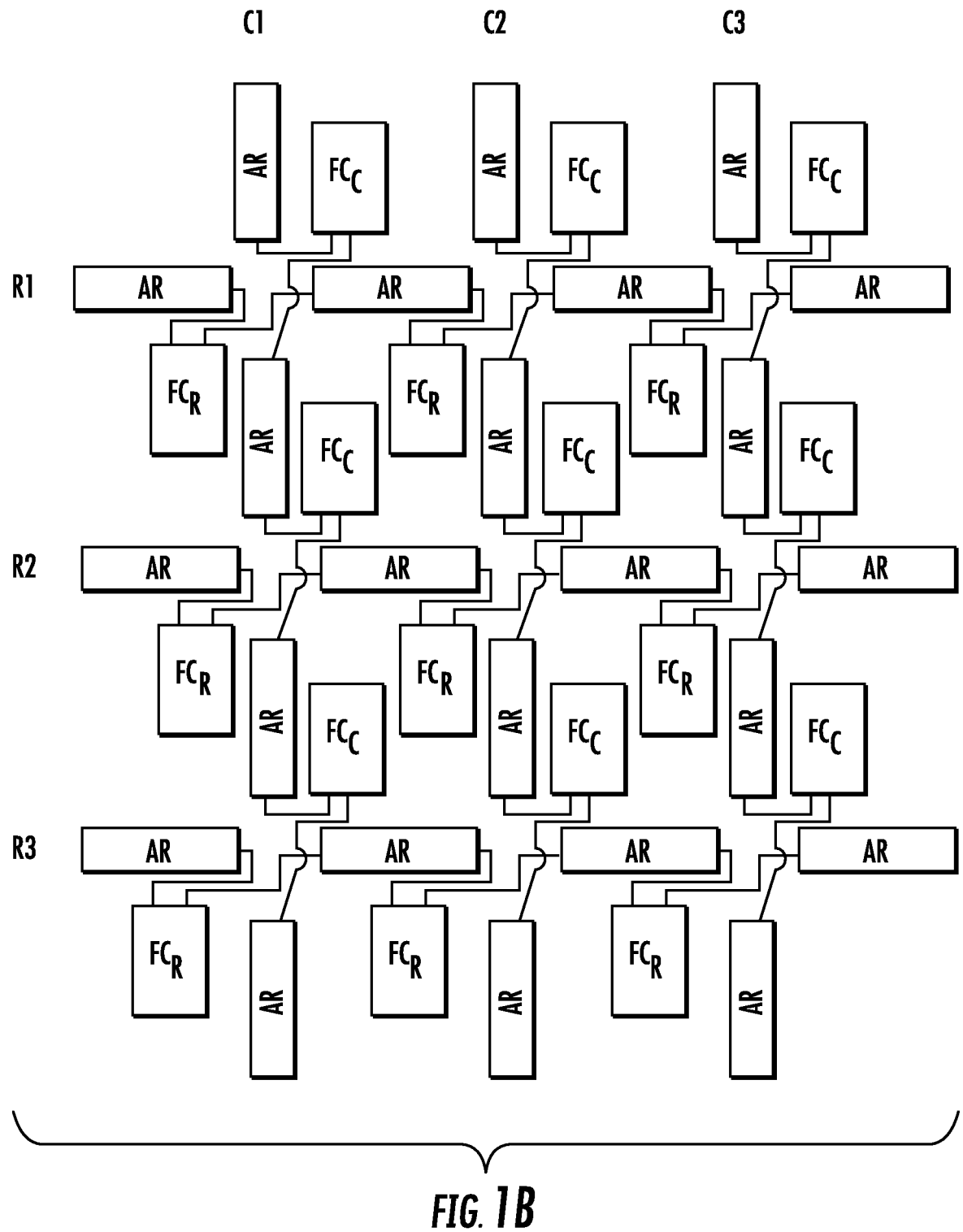
FIGS. 1B and 1C illustrate couplings between elements of the reconfigurable antenna device of FIG. 1A, according to various embodiments of present inventive concepts.
Figure 1C:
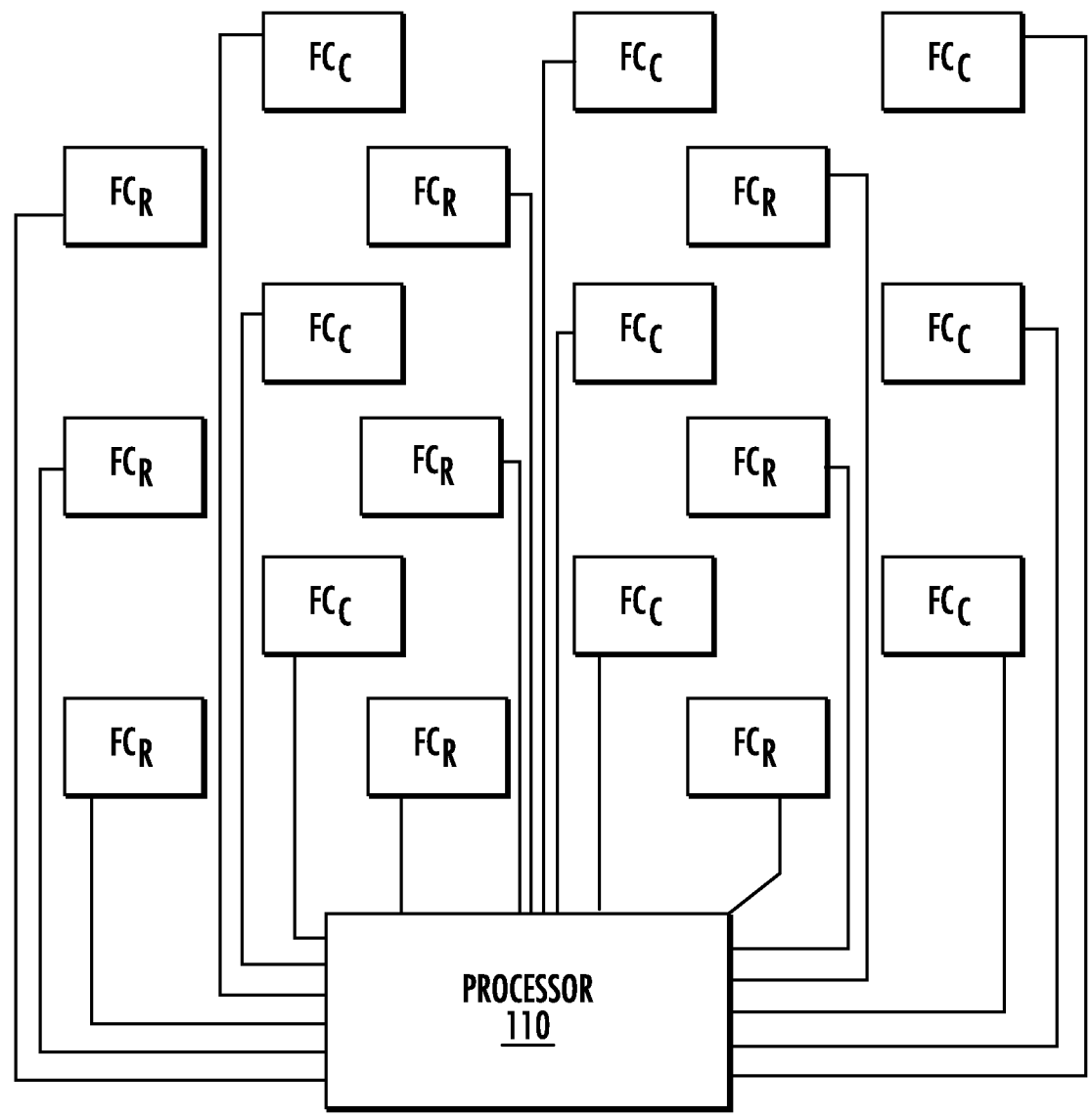

FIGS. 1B and 1C illustrate couplings between elements of the reconfigurable antenna device 100 of FIG. 1A, according to various embodiments of present inventive concepts. Referring to FIG. 1B, the reconfigurable antenna device 100 may include columns $C_1$-$C_3$ and rows $R_1$-$R_3$ of the antenna radiators AR of FIG. 1A. As illustrated by FIG. 1B, the antenna radiators AR are not directly connected to each other. The antenna radiators AR may thus be referred to herein as being spaced apart from each other. Alternatively, in some embodiments, contiguous connection of these antenna radiators AR is possible. Moreover, as the antenna radiators AR may optionally be on the same chip (e.g., a semiconductor chip), they may be referred to herein as being "on-chip." The antenna radiators AR can also be located on the same substrate, e.g., printed circuit boards or packaging structures using materials, such as FR4, Low Temperature Co-fired Ceramics (LTCC), liquid crystal polymer (LCP). The antenna radiators AR may can also locate on different semiconductor chips, different substrates, or a combination of semiconductor chips and substrates. The antenna radiators AR may also be referred to herein as antenna "sections," antenna "elements," antenna "radiator segments," or antenna "radiation segments."

Also, the term "RF" will be understood as the frequency at which signals can be radiated or received through antenna structures. Accordingly, the term "RF," as used herein, is not limited to 1 GHz-30 GHz. Rather, antenna concepts herein may, in some embodiments, be used at 60 GHz or a higher frequency. For example, RF signals may be may be radiated or received through the antenna radiators AR at $10^6$ Hz (1 MHz) to $10^{12}$ (1 THz).

The feed circuits FC of the reconfigurable antenna device 100 may include feed circuits $FC_C$ that are coupled to antenna radiators AR in the columns $C_1$-$C_3$ and feed circuits $FC_R$ that are coupled to antenna radiators AR in the rows $R_1$-$R_3$. The feed circuits $FC_C$ are independently-controllable relative to each other and relative to the feed circuits $FC_R$. Also, as input power from a group of feeds can be cumulative, each of the rows $R_1$-$R_3$ of antenna radiators AR and corresponding feed circuits $FC_R$ may support antenna-level power combining, and each of the plurality of columns $C_1$-$C_3$ of antenna radiators AR and corresponding feed circuits $FC_C$ may support antenna-level power combining.

Although FIG. 1B illustrates wired electrical connections between the feed circuits FC and the antenna radiators AR, the feed circuits FC may alternatively be coupled to the antenna radiators AR wirelessly via electromagnetic coupling. Moreover, although FIG. 1B illustrates three columns $C_1$-$C_3$ and three rows $R_1$-$R_3$ of the antenna radiators AR arranged in a two-dimensional grid, more (e.g., four, five, six, seven, or more) or fewer (e.g., one or two) rows and/or columns of the antenna radiators AR may be included in the reconfigurable antenna device 100. Similarly, although FIG. 1B illustrates that each column and row includes four antenna radiators AR, more (e.g., five, six, seven, eight, or more) or fewer (e.g., three) antenna radiators AR may be included in each column and row.

Each of the feed circuits FC may be electrically or electromagnetically coupled to a plethora (e.g., one, two, three, or more) of the antenna radiators AR. Moreover, in embodiments including connected/contiguous connection antenna radiators, it will be one antenna radiator AR that is coupled to the plurality of feed circuits FC. Referring still to FIG. 1B, each of the feed circuits FC may be electrically or electromagnetically coupled to two of the antenna radiators AR. For example, each of the feed circuits $FC_C$ may be electrically or electromagnetically coupled to two antenna radiators AR in the columns $C_1$-$C_3$, and each of the feed circuits $FC_R$ may be electrically or electromagnetically coupled to two antenna radiators AR in the rows $R_1$-$R_3$. As an example, column $C_1$ illustrates four antenna radiators AR, and three feed circuits $FC_C$ that are coupled to respective pairs of those four antenna radiators AR. In some embodiments, multiple feed circuits FC may be combined. For example, a feed circuit $FC_C$ may be combined with an adjacent feed circuit $FC_R$ and flip-chip bonded at an intersection of four antenna radiators AR (i.e., at an intersection of a row R with a column C).

As used herein, the term "pair" refers to two adjacent antenna radiators AR, and includes the possibility that some of the antenna radiators AR may be in more than one pair. For example, referring again to column $C_1$, the topmost feed circuit $FC_C$ is coupled to a first pair that includes first and second antenna radiators AR, a middle feed circuit $FC_C$ is coupled to a second pair that includes the second antenna radiator AR and a third antenna radiator AR, and a lowermost feed circuit $FC_C$ is coupled to a third pair that includes the third antenna radiator AR and a fourth antenna radiator AR. Accordingly, the words "respective pairs," as used herein, refer to groups of two adjacent antenna radiators AR, where each group/pair includes a different, unique combination of the antenna radiators AR, but where some of the antenna radiators AR may be in two groups/pairs. Similarly, the words "respective pair" refer to a unique grouping of two of the antenna radiators AR, where the two antenna radiators AR may individually be included in other pairs. Each pair is thus a unique combination, although individual components of a pair may also be paired with another antenna radiator AR such that adjacent pairs may have some overlap.

Referring to FIG. 1C, the processor 110 may be coupled to each of the feed circuits FC of FIG. 1B. In particular, the processor 110 may be configured to individually, independently control each of the feed circuits FC. For example, the processor 110 may include one or more control circuits configured to control modulation of amplitude and/or phase of RF currents through each of the feed circuits FC on an individual, independent basis. The feed circuits FC may thus be referred to herein as "independently-controllable."

Figure 2A:
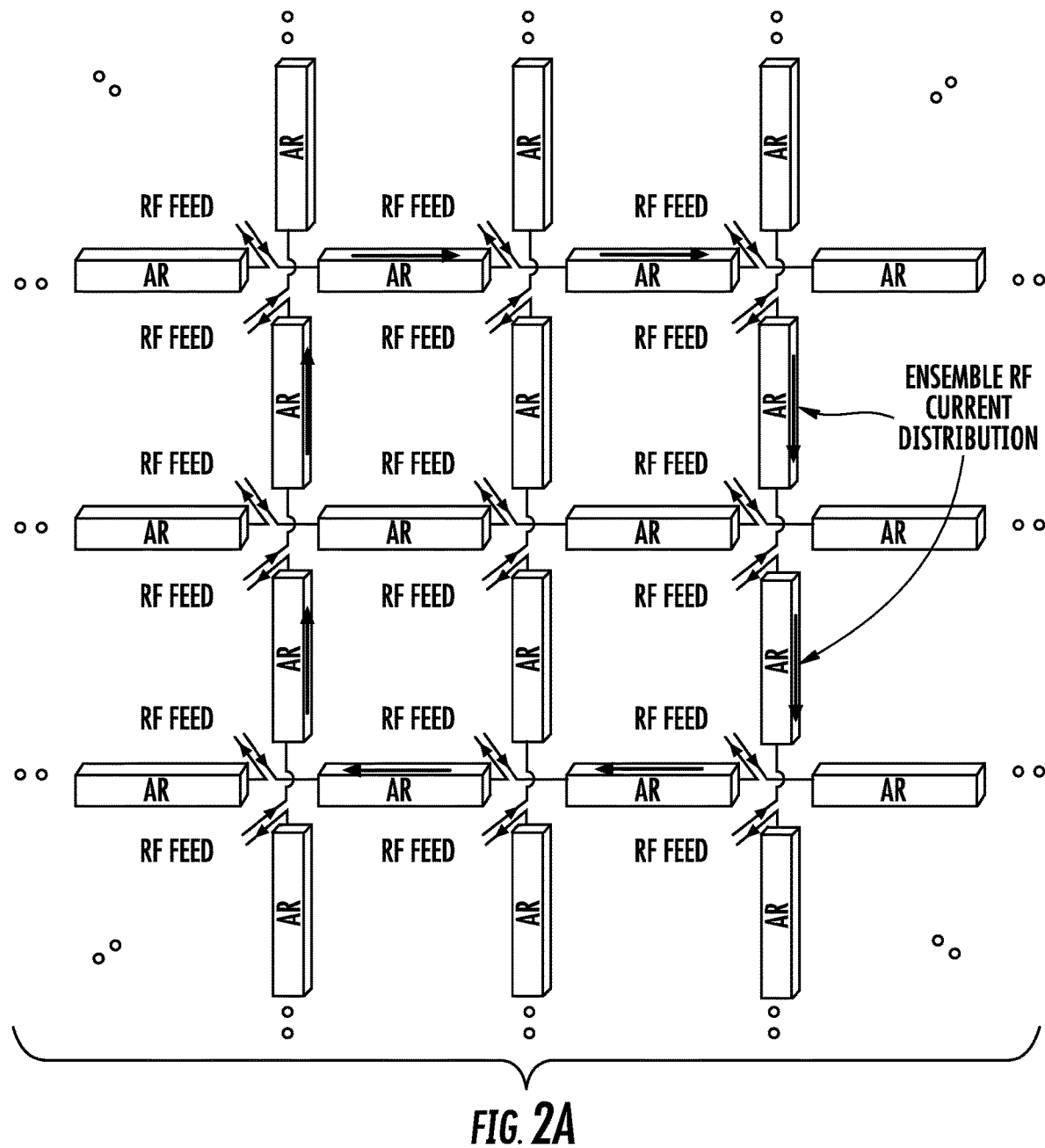
FIGS. 2A and 2B illustrate an example of reconfiguring the reconfigurable antenna device of FIGS. 1A-1C, according to various embodiments of present inventive concepts.
Figure 2B:
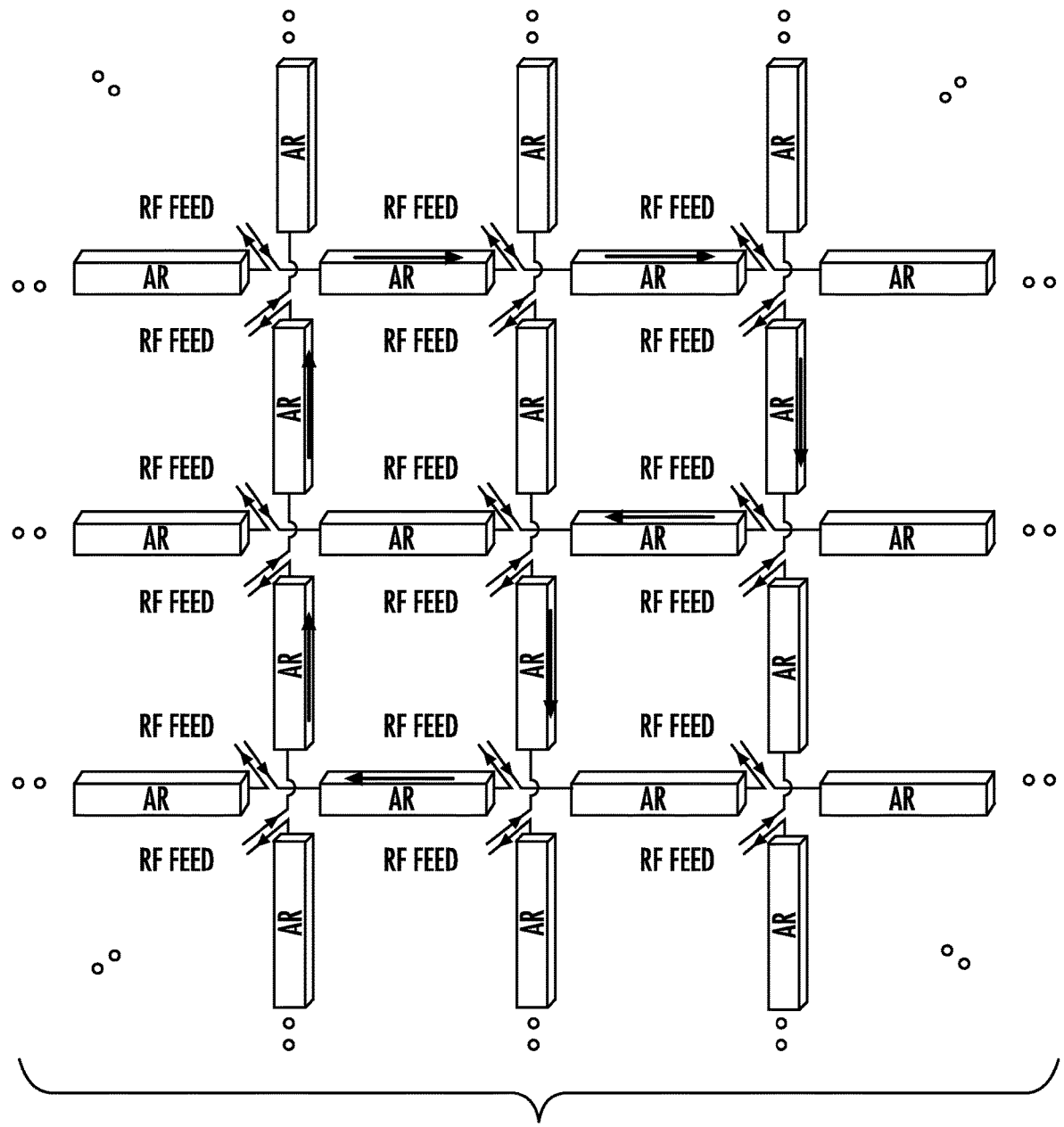

FIGS. 2A and 2B illustrate an example of reconfiguring the reconfigurable antenna device 100 of FIGS. 1A-1C, according to various embodiments of present inventive concepts. The arrows in FIGS. 2A and 2B indicate currents in a subset of the antenna radiators AR. Accordingly, ones of the antenna radiators AR that include an arrow in FIGS. 2A and 2B have been selected/activated, under the control of the processor 110, by one or more feed circuits FC that are coupled to those antenna radiators AR. Conversely, ones of the antenna radiators AR that do not include an arrow in FIGS. 2A and 2B have not been selected/activated. The selected antenna radiators AR may be referred to herein as "active," whereas the non-selected antenna radiators AR may be referred to herein as "inactive." In some embodiments, each feed circuit FC may be configured to selectively activate, and control current of, no more than two of the antenna radiators AR.

Collectively, the feed circuits FC can selectively activate any subset of the antenna radiators AR, and can thus easily reconfigure a distribution of current of (e.g., current on surfaces of) the antenna radiators AR. For example, FIG. 2B illustrates a reconfiguration of the distribution of current that is illustrated in FIG. 2A. Specifically, FIG. 2A illustrates currents in a first group/subset (active ones) of the antenna radiators ARs of FIG. 1B, and FIG. 2B illustrates a reconfiguration that provides currents in a different (from FIG. 2A) second group/subset of the antenna radiators ARs of FIG. 1B. FIGS. 2A and 2B may thus be referred to as providing different respective current patterns. Moreover, although FIGS. 2A and 2B are illustrated as a sequence in which the current pattern of FIG. 2A is provided before the current pattern of FIG. 2B, this sequence could be reversed, as the feed circuits FC can selectively activate any subset of the antenna radiators AR to provide any current pattern that is selectable using the antenna radiators AR. The feed circuits FC can provide any sequence of such current patterns, and are limited neither by the current patterns illustrated in FIGS. 2A and 2B nor by a single instance of reconfiguration. Rather, the feed circuits FC can provide a sequence of reconfigurations (e.g., two, three, four, or more reconfigurations) of currents in the antenna radiators AR.

Figure 3:
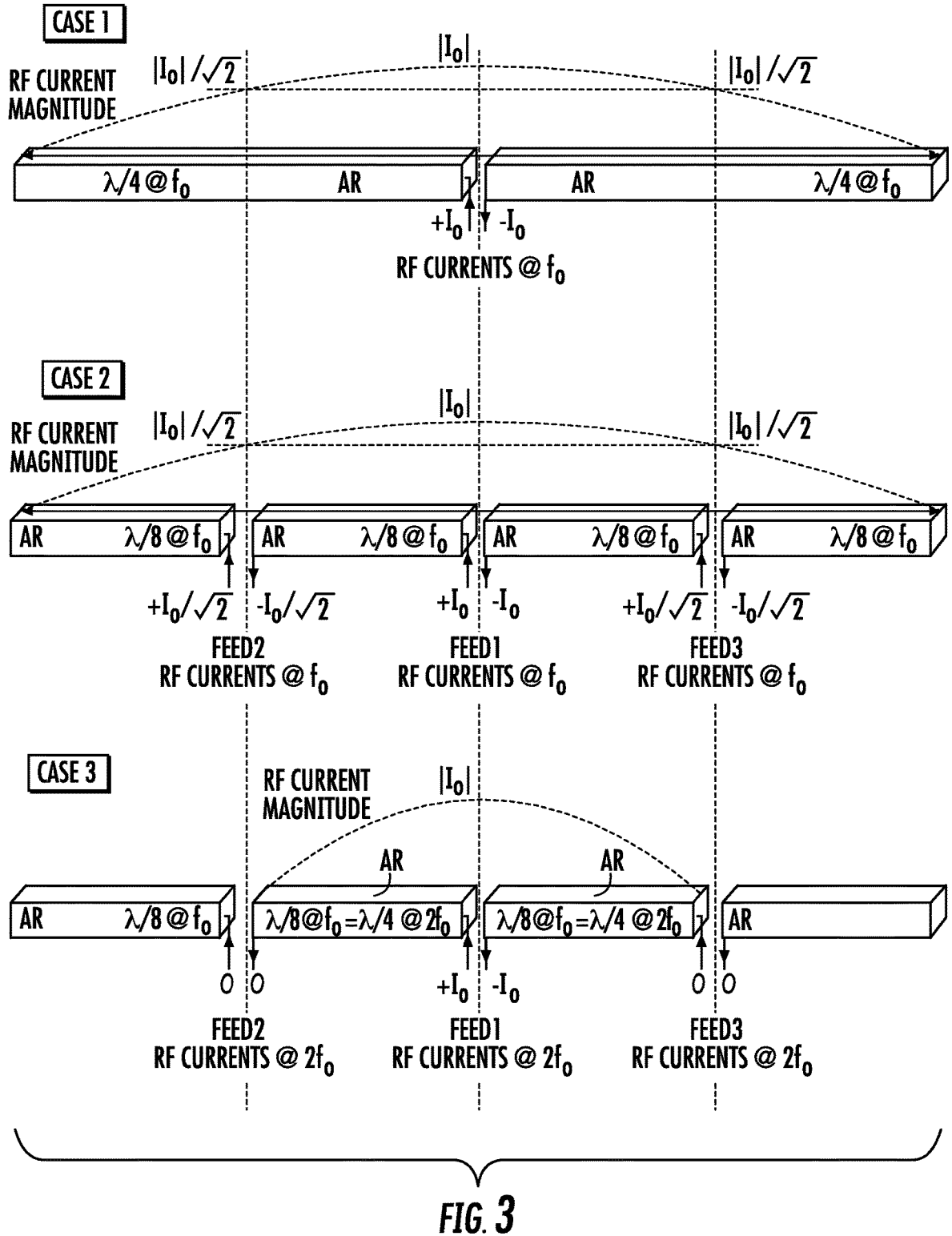
FIG. 3 illustrates an example of reconfiguring the reconfigurable antenna device of FIGS. 1A-1C, according to various embodiments of present inventive concepts, as well as a comparison with a single-feed antenna device.

FIG. 3 illustrates an example of reconfiguring the reconfigurable antenna device 100 of FIGS. 1A-1C, according to various embodiments of present inventive concepts, as well as a comparison with a single-feed antenna device. Specifically, FIG. 3 illustrates Cases 1-3, where Case 1 (prior art) shows two antenna radiators ARs with a single feed (i.e., without multiple feeds), and Cases 2 and 3 show four antenna radiators ARs and three Feeds 1-3 according to various embodiments of present inventive concepts.

The reconfigurable antenna device 100 may be configured to provide Case 2. In particular, Case 2 illustrates that the reconfigurable antenna device 100 can use the three Feeds 1-3 to control currents in the four antenna radiators AR to provide the same RF current magnitude that is provided by the single-feed antenna device of Case 1. The three Feeds 1-3 may be provided by three of the feed circuits FC, respectively.

The reconfigurable antenna device 100 may also be configured to provide Case 3, which illustrates a reconfiguration of Case 2. In Case 2, all four of the antenna radiators AR are active. In Case 3, however, the two outermost antenna radiators AR have zero RF current and thus are inactive, while the middle two antenna radiators AR are still active. The Feeds 1-3 (e.g., respective feed circuits FC) can be independently controlled by the processor 110 using different current amplitudes and phases to control RF currents of the antenna radiators AR. Accordingly, each of the plurality of independently-controllable feed circuits FC may be configured to control amplitude and/or phase of RF current of at least one radiator among a respective pair of the antenna radiators AR coupled thereto. Based on Case 2 and Case 3, the configurability of the disclosed antenna structure may achieve operation frequency reconfigurability from $f_0$ (Case 2) to $2f_0$ (Case 3).

In some embodiments, feed currents of two or more of the Cases 1-3 may be combined (i.e., provided simultaneously as a composite) by the reconfigurable antenna device 100. Accordingly, Cases 1-3 may support a linear additive embodiment whereby the currents could be combined. For example, Cases 1 and 2 could be combined, Cases 1 and 3 could be combined, Cases 2 and 3 could be combined, or Cases 1, 2, and 3 could be combined. The present inventive entity appreciates, however, that combining two or more of the Cases 1-3 is merely one example of the ability to add/combine currents of different configurations of the antenna radiators AR.

Figure 4A:
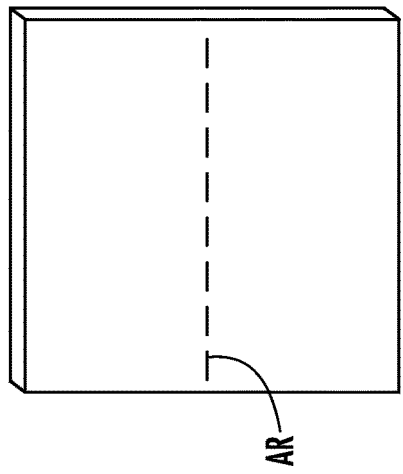
FIGS. 4A-4E illustrate various antenna radiator arrangements of the reconfigurable antenna device of FIGS. 1A-1C, according to various embodiments of present inventive concepts.
Figure 4B:
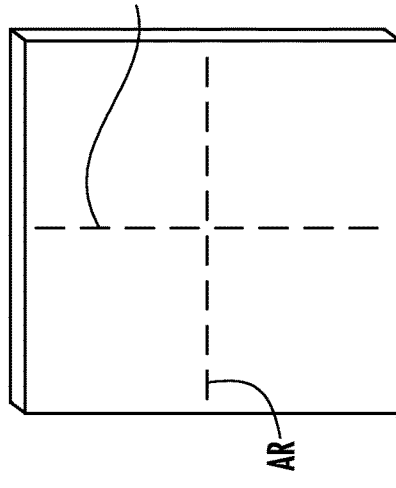
Figure 4C:
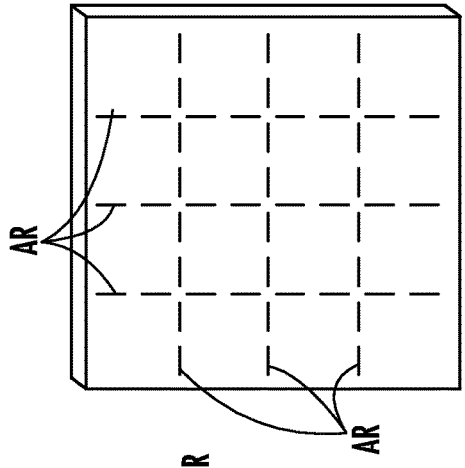
Figure 4D:
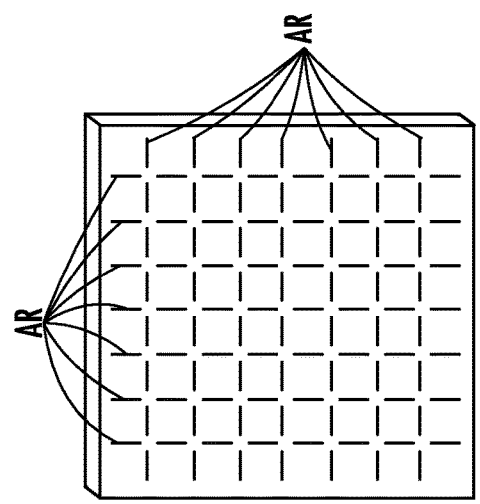

FIGS. 4A-4E illustrate various antenna radiator arrangements of the reconfigurable antenna device 100 of FIGS. 1A-1C, according to various embodiments of present inventive concepts. FIG. 4A illustrates an example in which the reconfigurable antenna device 100 includes eight antenna radiators AR in a single row. FIG. 4B illustrates that the single row in FIG. 4A may optionally be intersected by a single column of eight more antenna radiators AR. FIGS. 4C and 4D illustrate that the reconfigurable antenna device 100 may include a plurality of columns and a plurality of rows of antenna radiators AR.

Figure 4E:
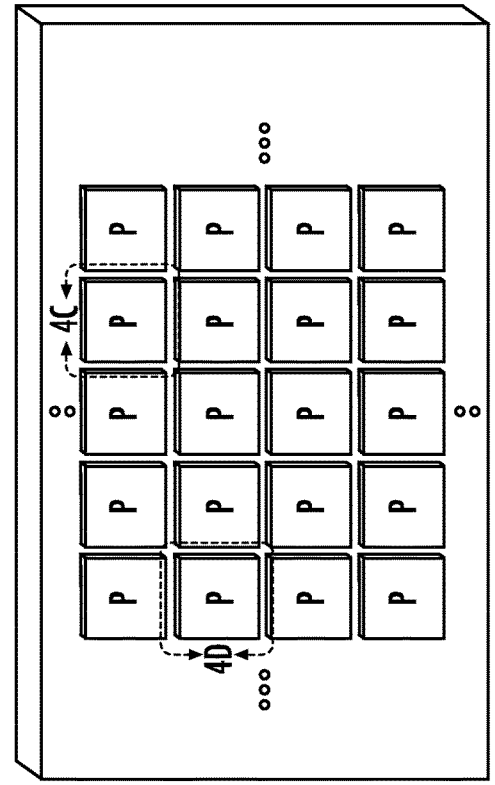

The arrangement in each of FIGS. 4A-4D may be referred to as an electrically-reconfigurable antenna "pixel" P that is defined by the antenna radiators AR therein. Each pixel P may include a plurality of antenna radiators AR and a plurality of feed circuits FC that are coupled to respective pairs of the antenna radiators AR. Accordingly, FIG. 1B may represent a pixel P. In some embodiments, a plurality of pixels P may be included on the same chip. For example, FIG. 4E illustrates a plurality of rows and a plurality of columns of pixels P (including the respective pixels P of FIGS. 4C and 4D), all of which may be on the same chip. Multiple pixels P form an antenna array. The antenna array can be homogeneous with identical pixels or inhomogeneous with non-identical pixels.

Figure 5:
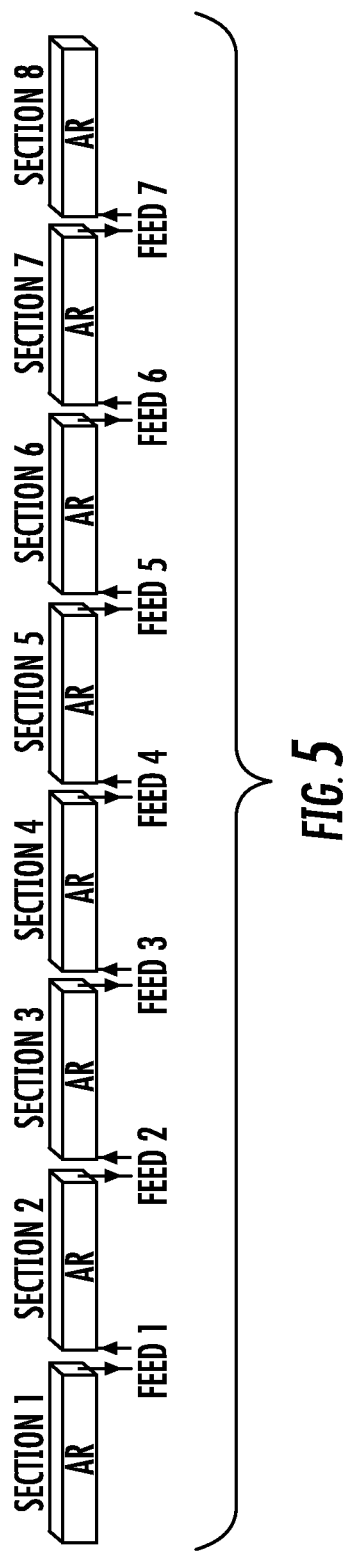
FIG. 5 illustrates a detailed view of the antenna radiators that are in FIG. 4A, according to various embodiments of present inventive concepts.

FIG. 5 illustrates a detailed view of the antenna radiators AR that are in the antenna pixel P of FIG. 4A, according to various embodiments of present inventive concepts. In particular, FIG. 5 illustrates eight antenna radiators AR, which are labeled as antenna Sections 1-8, as well as Feeds 1-7 (e.g., provided by seven feed circuits FC, respectively). Accordingly, the reconfigurable antenna device 100 according to various embodiments herein includes N RF feeds, and N+1 antenna radiators AR, where N is a natural number of two or more. Each of the Feeds 1-7 is coupled to two of the Sections 1-8. Alternatively, there may be M antenna radiators AR, where M and N are both positive integers greater than one.

The following Table 1 illustrates a normalized current vector of the 8-Section/7-Feed antenna pixel P of FIG. 5. The abbreviation "Sect." in Table 1 refers to the number of antenna radiator sections/segments that are enabled.

TABLE 1

| # of Enabled Sections | Center Frequency | Feed 1 | Feed 2 | Feed 3 | Feed 4 | Feed 5 | Feed 6 | Feed 7 |
|---|---|---|---|---|---|---|---|---|
| 2 Sect., 1 Feed | 11 GHz | N.A. | N.A. | N.A. | 1 | N.A. | N.A. | N.A. |
| 3 Sect., 2 Feeds | 7.2 GHz | N.A. | N.A. | 0.89 | 0.89 | N.A. | N.A. | N.A. |
| 4 Sect., 3 Feeds | 5.35 GHz | N.A. | N.A. | 0.73 | 1 | 0.73 | N.A. | N.A. |
| 5 Sect., 4 Feeds | 4.31 GHz | N.A. | 0.58 | 0.91 | 0.91 | 0.58 | N.A. | N.A. |
| 6 Sect., 5 Feeds | 3.65 GHz | N.A. | 0.47 | 0.77 | 0.88 | 0.77 | 0.47 | N.A. |
| 7 Sect., 6 Feeds | 3.1 GHz | 0.51 | 0.82 | 1 | 1 | 0.82 | 0.51 | N.A. |
| 8 Sect., 7 Feeds | 2.8 GHz | 0.33 | 0.60 | 0.77 | 0.81 | 0.77 | 0.60 | 0.33 |

Moreover, the following Table 2 illustrates the feed impedance at each feed of the 8-Section/7-Feed antenna pixel P of FIG. 5.

TABLE 2

| # of Enabled Sections | Center Frequency | Feed 1 | Feed 2 | Feed 3 | Feed 4 | Feed 5 | Feed 6 | Feed 7 |
|---|---|---|---|---|---|---|---|---|
| 2 Sect., 1 Feed | 11 GHz | N.A. | N.A. | N.A. | 60.7 + j1.65 | N.A. | N.A. | N.A. |
| 3 Sect., 2 Feeds | 7.2 GHz | N.A. | N.A. | 37.8 − j0.5 | 37.8 − j0.5 | N.A. | N.A. | N.A. |
| 4 Sect., 3 Feeds | 5.35 GHz | N.A. | N.A. | 33.4 − j2.1 | 26 + j1.7 | 33.4 − j2.1 | N.A. | N.A. |
| 5 Sect., 4 Feeds | 4.31 GHz | N.A. | 32 + j1.5 | 24 + j2.3 | 24 + j2.3 | 32 + j1.5 | N.A. | N.A. |
| 6 Sect., 5 Feeds | 3.65 GHz | N.A. | 32 − j1.5 | 23 − j0.3 | 21.9 + j0.4 | 23 − j0.3 | 32 − j1.5 | N.A. |
| 7 Sect., 6 Feeds | 3.1 GHz | 24.5 − j3.3 | 16 + j10 | 13 + j0.48 | 13 + j0.48 | 16 + j10 | 24.5 − j3.3 | N.A. |
| 8 Sect., 7 Feeds | 2.8 GHz | 32 − j1.4 | 23.2 + j2.5 | 21 + j1.4 | 20.5 + j1.8 | 21 + j1.4 | 23.2 + j2.5 | 32 − j1.4 |
| Ideal λ/2 Dipole | | N.A. | | | 77 ohm @ MiddleFeed | | | |

Tables 1 and 2 illustrate that different RF feeds are independently controlled to provide different currents and impedances. In Tables 1 and 2, the indicator "N.A." refers to an inactive feed or an otherwise not applicable value, whereas a numerical value refers to an active feed. When a feed is active, it controls a current of at least one of the pair, among the Sections 1-8, of radiators/sections to which it is coupled.

Tables 1 and 2 also illustrate different current and feed impedance values for different numbers of "Enabled Sections" (i.e., the Sections 1-8). In particular, Tables 1 and 2 illustrate that each RF feed is configured to enable (e.g., activate/select) a pair of the Sections 1-8. For example, Tables 1 and 2 illustrate that Feed 4 is configured to enable two of the Sections 1-8. Moreover, Feeds 3 and 4 are configured to collectively enable three of the Sections 1-8. At least one of the antenna radiators AR may be coupled to two feed circuits FC. As an example, FIG. 5 illustrates that Section 4 is coupled to Feeds 3 and 4.

Figure 6:
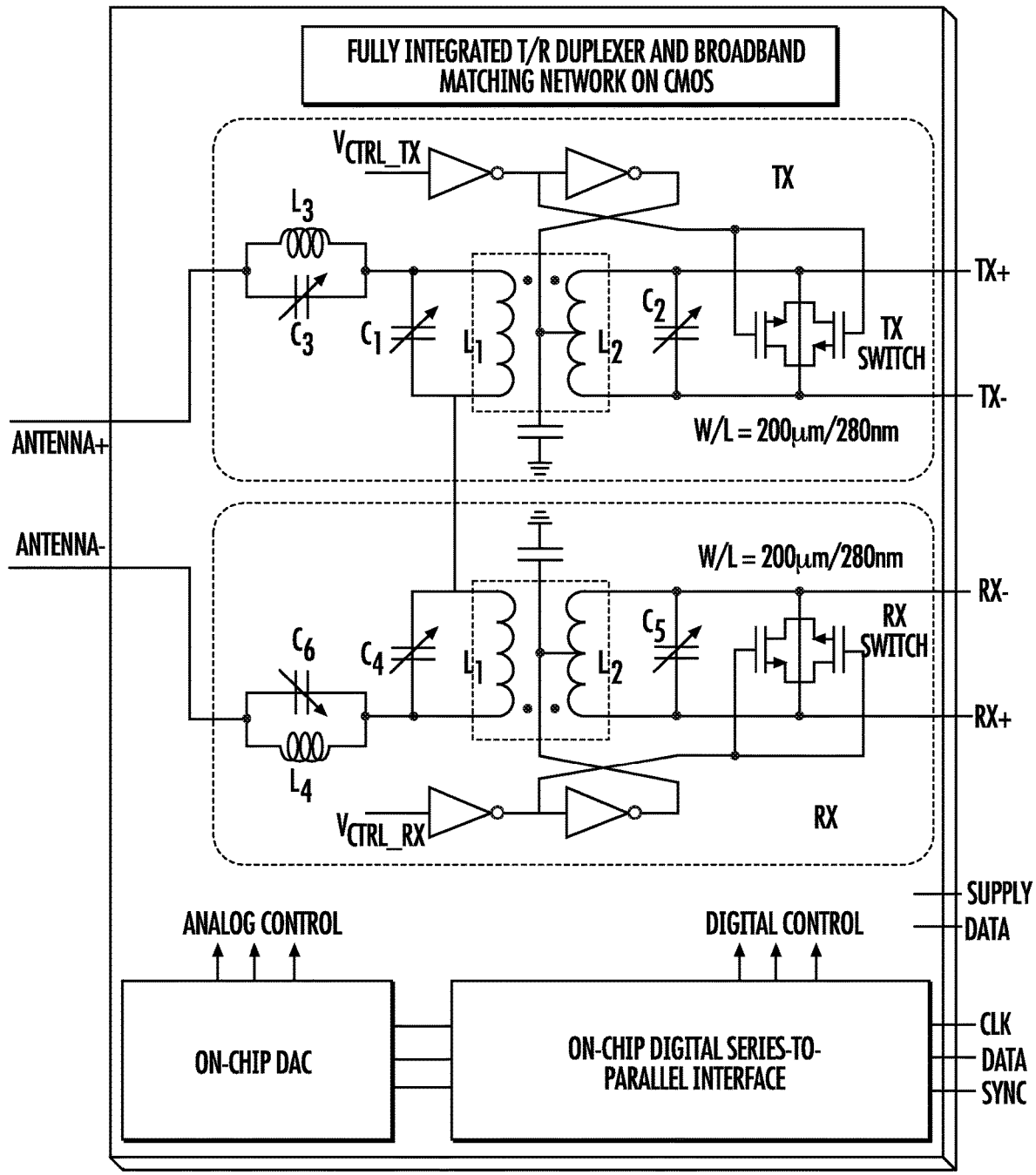
FIG. 6 illustrates a diagram of a feed circuit of FIGS. 1A-1C, according to various embodiments of present inventive concepts.

FIG. 6 illustrates a diagram of a feed circuit FC of FIGS. 1A-1C, according to various embodiments of present inventive concepts. The feed circuit FC may be an RF interface circuit that is configured to operate as a transmit (TX)/receive (RX) duplexer and broadband matching network. The feed circuit FC can thus control impedance for both transmitting and receiving. The feed circuit FC of FIG. 6 also supports reciprocity between transmitting and receiving such that transmit and receive modes have the same antenna characteristics. For example, the current distribution of a group of antenna radiators AR can be identical in both transmit and receive modes. The transmit and receive modes may also have the same active pulling mode among the multiple feeds, and may have the same antenna pattern, frequency, and bandwidth, among other antenna characteristics. In some embodiments, the feed circuit FC can include other circuitries, including low noise amplifiers, power amplifiers, drivers, and mixers. For example, the transmitting ports (i.e., TX+ and TX−) can be connected to the outputs of one or more power amplifiers. Moreover, the receiving ports (i.e., RX+ and RX−) can be connected to the inputs of one of more low noise amplifiers.

Each feed circuit FC is also configured to support impedance reciprocity, whereby each of the many transmitting configurations of the reconfigurable antenna device 100 can be matched when switching from transmitting to receiving. Thus, each pair of antenna radiators AR, which are coupled together by a potentially unique effective impedance Z=R+jX during transmission, can also be coupled together by the same impedance when the antenna radiators AR are converting an incoming signal to a received current signal that passes through the effective impedance. Assuming 100% efficiency (on transmit/receive) and ideal reciprocity, outgoing (from the feed circuits FC) feed currents for each pair of antenna radiators AR would match corresponding incoming (to the feed circuits FC) feed currents whenever the transmit antenna signal (shape) matches the incoming signal being captured by the reconfigurable antenna device 100. Each feed circuit FC may thus operate as a variable impedance element when the reconfigurable antenna device 100 receives incoming signals (i.e., during a receive/receiver "mode").

The circuit in FIG. 6 may be referred to herein as an "RF interface circuit." Accordingly, the reconfigurable antenna device 100 may include a plurality of antenna elements (e.g., the antenna radiators AR) that are linked together by a plurality of independently-controllable RF interface circuits that support impedance (Z) adjustment during transmit (TX) and receive (RX) modes of operation, where $[Z_{RX}]=[Z_{TX}]^*$, where $[Z_{TX}]$ designates a transmit driving impedance matrix, and where $[Z_{RX}]$ designates a receive termination impedance matrix. Moreover, each impedance element in the impedance matrix may represent the impedance for the corresponding antenna feed. Accordingly, $Z_{RX}$ may be the complex conjugate of $Z_{TX}$. The present inventive entity appreciates that this is a mathematically and physically desirable/optimum solution, e.g., to maximize the power transfer in the receiving mode. A practical design may also adopt other $Z_{RX}$ and $Z_{TX}$ relationships. The plurality of independently-controllable RF interface circuits may, in some embodiments, be configured to selectively provide: (i) a particular one of a plurality of transmit driving impedances $Z_{TX}$ during the TX mode; and (ii) a particular one of a plurality of receive termination impedances $Z_{RX}$ (during the RX mode. The plurality of transmit driving impedances $Z_{TX}$ may provide a matrix of impedance values, at least some of which may be different (i.e., unequal) from each other. Moreover, the plurality of receive termination impedances $Z_{RX}$ may provide a matrix of impedance values, at least some of which may be different from each other. Accordingly, $[Z_{RX}]$ and $[Z_{TX}]$ are both impedance matrices, each with multiple impedance values that correspond to the multiple feeds.

In some embodiments, each RF interface circuit may control only one pair of antenna elements. As an example, for two pairs of antenna elements, two RF interface circuits may be used. Alternatively, other numbers of antenna elements may be coupled to each RF interface circuit, or the antenna elements may even be coupled to no RF interface circuit (e.g., in the case of TX-only or RX-only arrays).

In some embodiments, each of the RF interface circuits may include two duplexers (e.g., one duplexer for each of the two antenna elements coupled to each RF interface circuit). For example, the plurality of antenna elements may include N+1 antenna elements and the plurality of RF interface circuits may include N pairs of duplexers, where N is a positive integer greater than one. A first of the plurality of RF interface circuits may include a first duplexer coupled to a first of the plurality of antenna elements and a second duplexer coupled to a second of the plurality of antenna elements. A second of the plurality of RF interface circuits may include a first duplexer coupled to the second of the plurality of antenna elements and a second duplexer coupled to a third of the plurality of antenna elements. Moreover, the first of the plurality of RF interface circuits may operate as a first RF current feed or voltage driving circuit during the TX mode of operation. Accordingly, the antenna feeds can be driven by current or voltage, depending on the type of the antenna.

In some embodiments, the second duplexer in the first of the plurality of RF interface circuits may be coupled to a first end of the second of the plurality of antenna elements and the first duplexer in the second of the plurality of RF interface circuits may be coupled to a second end of the second of the plurality of antenna elements. During the TX mode of operation, the first end of the second of the plurality of antenna elements may be electrically connected to a first parallel LC circuit (with variable C) within the second duplexer. During the RX mode of operation, the first end of the second of the plurality of antenna elements may be electrically connected to a second parallel LC circuit (with variable L) within the second duplexer.

Figure 7:
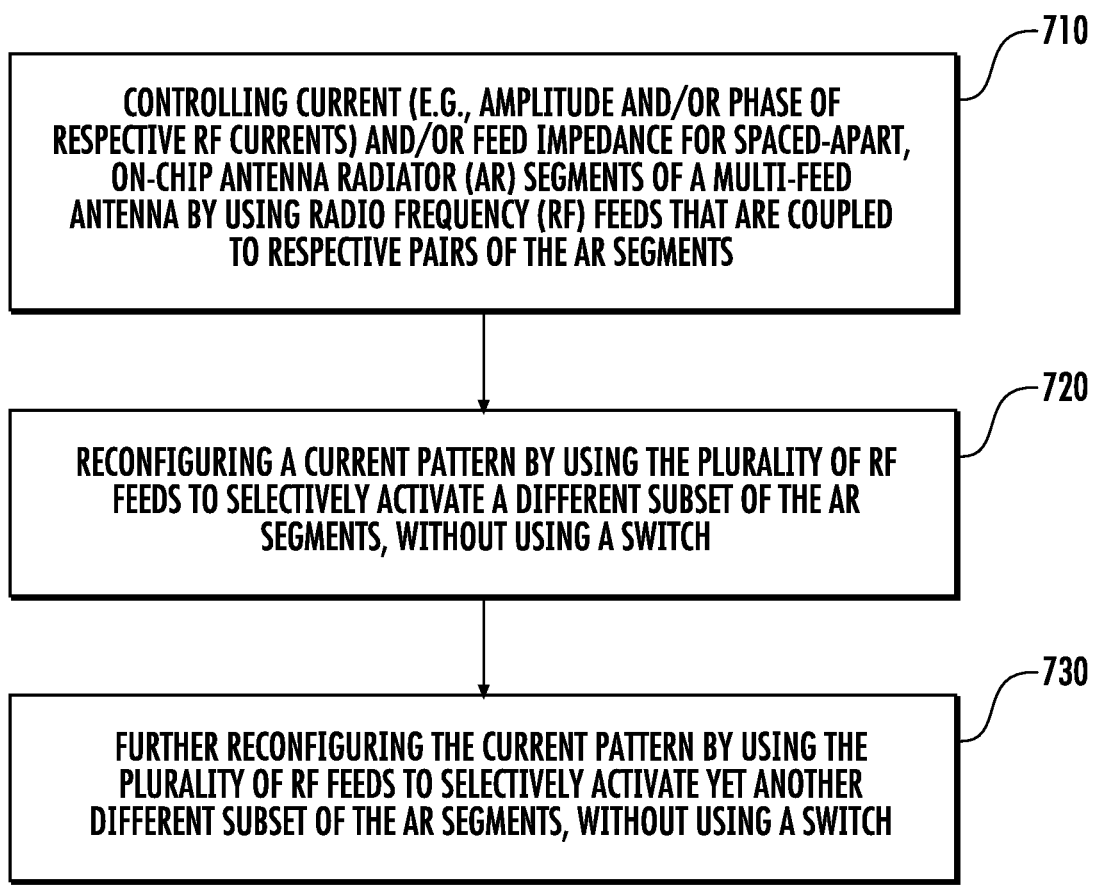
FIG. 7 is a flowchart illustrating operations of the reconfigurable antenna device of FIGS. 1A-1C, according to various embodiments of present inventive concepts.

FIG. 7 is a flowchart illustrating operations of the reconfigurable antenna device 100 of FIGS. 1A-1C, according to various embodiments of present inventive concepts. The operations may include controlling (Block 710) current of (e.g., current on surfaces of) a plurality of spaced-apart, antenna radiator segments (e.g., the antenna radiators AR) of a multi-feed antenna by using a plurality of RF feeds (e.g., provided by the feed circuits FC, respectively) that are coupled to respective pairs of the plurality of spaced-apart, antenna radiator segments. Although Block 710 indicates "on-chip" antenna radiator segments, the present inventive entity appreciates that the antenna radiator segments are not limited to being on the same chip (rather, this is optional). The RF feeds may also control feed impedances of the reconfigurable antenna device 100. For example, each of the plurality of RF feeds may control a respective feed impedance.

In some embodiments, the plurality of RF feeds include N RF feeds, and the plurality of spaced-apart, antenna radiator segments include N+1 antenna radiator segments. The N+1 antenna radiator segments may include a plurality of rows and a plurality of columns, respectively, of antenna radiator segments. Moreover, operations in Block 710 of controlling current may include providing a current pattern/distribution that is defined by a subset of the N+1 antenna radiator segments by simultaneously driving multiple ones of the plurality of RF feeds to control current of at least portions of each of first and second ones of the plurality of rows, and at least portions of each of first and second ones of the plurality of columns, of antenna radiator segments. For example, the reconfigurable antenna device 100 may provide a current pattern/distribution by controlling an amplitude and/or a phase of respective RF currents in the N+1 antenna radiator segments in the subset.

Referring still to FIG. 7, the operations of the reconfigurable antenna device 100 may include reconfiguring (Block 720) the current pattern/distribution by using the plurality of RF feeds to control current of a different subset of the N+1 antenna radiator segments. Reconfiguring may include selectively activating/enabling the different subset of the N+1 antenna radiator segments by reconfiguring the amplitude and/or phase of the terminal current or voltage at each feed by the feed circuits, in contrast to conventional approaches that use passive switches between the antenna radiator segments. The antenna radiator segments may thus be referred to herein as "selectable" by the RF feeds. Moreover, the switchless reconfiguring may mean that adjacent ones of the antenna radiator segments are free of a direct connection to a transistor, a diode, or a Microelectromechanical systems (MEMS) component between the adjacent ones of the antenna radiator segments, with the exception of interface circuits or driving circuits, which may have transistors, and to which the radiator segments are connected.

After the reconfiguring in Block 720, the operations of the reconfigurable antenna device 100 may include further reconfiguring (Block 730) the current pattern/distribution by using the plurality of RF feeds to selectively activate/enable, and control current (e.g., amplitude and phase) of, yet another different subset of the N+1 antenna radiator segments. This subset may be a third subset that is different from the subsets of both Block 710 and Block 720. Although Blocks 720 and 730 illustrate first and second reconfigurations, the reconfigurable antenna device 100 may be reconfigured numerous (e.g., dozens, hundreds, thousands, or more) times, and is not limited to only a first, second, third, or fourth reconfiguration.

The present inventive entity appreciates that antenna reconfiguration may refer to reconfiguration of one or more radiation characteristics, including radiation frequency, pattern, polarization, and mode/antenna-type.

In some embodiments for signal transmitting, multiple (two or more) different signals can be concurrently transmitted through the same multi-feed antenna and radiated through different radiation characteristics, including operation frequency, pattern, polarization, and mode/antenna-type. For example, we can consider two independent RF signals, $S_1(t)$ and $S_2(t)$. The multiple feed circuits can feed the signal $S_1(t)$ to the multiple feeds with a first set of terminal RF currents or voltages. Thus, $S_1(t)$ is radiated by the multi-feed antenna through a first antenna pattern. At the same time, the multiple feed circuits can feed the signal $S_2(t)$ to the multiple feeds with a second set of terminal RF currents or voltages. Thus, $S_2(t)$ is radiated by the multi-feed antenna through a second antenna pattern.

Similarly, in some embodiments for signal receiving, multiple (two or more) different signals can be concurrently received through the same multi-feed antenna through different radiation characteristics, including operation frequency, pattern, polarization, and mode/antenna-type. For example, we can consider two independent RF signals, $S_1(t)$ and $S_2(t)$, both as incident electromagnetic waves onto the same multi-feed antenna. The signal $S_1(t)$ will result in one combination of RF outputs at the outputs of the multiple feed circuits; the characteristics of these RF outputs (e.g., relative phases and amplitudes) are determined by the characteristics of the signal $S_1(t)$. Simultaneously, the signal $S_2(t)$ will also result in a different combination of RF outputs at the output of the multiple feed circuits governed by the characteristics of the signal $S_2(t)$. If signals $S_1(t)$ and $S_2(t)$ exhibit different characteristics, e.g., frequency, polarization, direction, their resulting RF outputs at the outputs of the multiple feed circuits will present different relationship (e.g., relative phases and amplitudes). Baseband circuits and processor circuits of the reconfigurable antenna device 100 can distinguish such different relationship and thus allow the receiving of these two independent RF signals $S_1(t)$ and $S_2(t)$ simultaneously.

In some embodiments, the reconfigurable antenna device 100 may be referred to as a Reconfigurable antenna Array with distributed and co-adaptive Multi-feed antenna Pixels (RAMP) antenna. Accordingly, the reconfigurable antennas described herein may be based on distributed multi-feed structures. The RAMP antenna is composed of a network, e.g., 2D grid (although 3D arrays are also possible), of electrically small radiators (e.g., the antenna radiators AR) connected with distributed feeds (e.g., provided by the feed circuits FC, respectively). Accordingly, the reconfigurable antenna device 100 may, in some embodiments, be referred to as an electrically reconfigurable antenna with a plurality of antenna radiators (e.g., the antenna radiators AR) strung together by a plurality of independently-controllable feed circuits (e.g., the feed circuits FC). The RAMP antenna provides control of the amplitude and phase of the RF current at each feed. As a result, the RAMP antenna may directly and actively synthesize the ensemble RF current distribution on the antenna radiator surfaces. Moreover, the RAMP antenna provides for reconfiguring of pixel radiation characteristics.

Accordingly, the RAMP antenna may provide fine-grained radiation pattern and frequency reconfigurability, in-pixel arbitrary polarization control, and in-pixel broadband operation. In contrast, the bandwidth of an antenna array with a single, fixed feeding point may be more limited. The RAMP antenna may also provide on-antenna power combining to enhance power handling/linearity. For example, because input power from a group of feeds may be cumulative, a multi-feed RAMP antenna can provide power combining on the antenna.

Moreover, switches and tunable elements may be located in a transmit/receive module (e.g., the feed circuit FC illustrated in FIG. 6), with none on the antenna radiators AR for current directing, thus providing low loss and high efficiency. Because the antenna radiators AR are switchless (i.e., are not interconnected by switches), they provide highly-flexible reconfigurability, as well as high efficiency and linearity. In contrast, an antenna array with switches between its radiating elements may have higher losses, as well as linearity issues and power-handling issues.

Accordingly, among other advantages, the reconfigurable antennas described herein may guide current via a plurality of RF feeds, instead of guiding current via switches between antenna radiation segments. Using multiple feeds may therefore enable switchless reconfigurability of an antenna array. Moreover, guiding current via the RF feeds may provide increased/full control of a current pattern, as each radiation segment is independently controlled via its RF feed(s).

Example embodiments are described herein with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout.

Example embodiments of present inventive concepts are described herein with reference to cross-sectional illustrations that are schematic illustrations of idealized embodiments and intermediate structures of example embodiments. As such, variations from the shapes of the illustrations as a result, for example, of manufacturing techniques and/or tolerances, are to be expected. Thus, embodiments of present inventive concepts should not be construed as limited to the particular shapes illustrated herein but may include deviations in shapes that result, for example, from manufacturing.

It should also be noted that in some alternate implementations, the functions/acts noted in flowchart blocks herein may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Finally, other blocks may be added/inserted between the blocks that are illustrated, and/or blocks/operations may be omitted without departing from the scope of present inventive concepts.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein, the term "and/or" includes any and all combinations of one or more of the associated listed items. Moreover, the symbol "/" (e.g., when used in the term "group/pair") will be understood to be equivalent to the term "and/or."

It will be understood that although the terms "first," "second," etc. may be used herein to describe various elements, these elements should not be limited by these terms. These terms are only used to distinguish one element from another. Thus, a first element could be termed a second element without departing from the teachings of the present embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if a device in the figures is turned over, elements described as "below" or "beneath" other elements or features would then be oriented "above" the other elements or features. Thus, the term "below" can encompass both an orientation of above and below. The device may be otherwise oriented (e.g., rotated 90 degrees or at other orientations) and the spatially relative descriptors used herein may be interpreted accordingly.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any, such combination or subcombination.

The above-disclosed subject matter is to be considered illustrative, and not restrictive, and the appended claims are intended to cover all such modifications, enhancements, and other embodiments, which fall within the true spirit and scope of present inventive concepts. Thus, to the maximum extent allowed by law, the scope is to be determined by the broadest permissible interpretation of the following claims and their equivalents, and shall not be restricted or limited by the foregoing detailed description.

What is claimed is:

1. An electrically-reconfigurable antenna, comprising:
a plurality of antenna elements linked together by a plurality of independently-controllable radio frequency (RF) interface circuits that support impedance (Z) reciprocity during transmit (TX) and receive (RX) modes of operation,
wherein the antenna comprises fewer of said plurality of RF interface circuits than said plurality of antenna elements,
wherein each of said plurality of RF interface circuits is configured to control at least one of a pair of said plurality of antenna elements,
wherein said plurality of antenna elements include a plurality of rows and a plurality of columns of radiators on a substrate, and
wherein each of the plurality of rows and each of the plurality of columns comprises N+1 radiators that are coupled to N RF interface circuits, and wherein N is a positive integer greater than one.

2. The antenna of claim 1, wherein said plurality of independently-controllable RF interface circuits are configured to selectively provide: (i) a particular one of a plurality of transmit driving impedances $Z_{TX}$ during the TX mode; and (ii) a particular one of a plurality of receive termination impedances $Z_{RX}$ during the RX mode.

3. The antenna of claim 1,
wherein each of said plurality of RF interface circuits is connected to only two of the radiators.

4. The antenna of claim 1, wherein said plurality of antenna elements and said plurality of independently-controllable RF interface circuits operate collectively to provide a reconfigurable antenna radiation frequency by reconfiguring a radiation current pattern within said plurality of antenna elements or activating/deactivating different ones of said plurality of antenna segments, in response to controlling terminal currents and/or terminal voltages provided by said plurality of independently-controllable RF interface circuits to said plurality of antenna elements.

5. The antenna of claim 1, wherein said plurality of antenna elements and said plurality of independently-controllable RF interface circuits operate collectively to provide a reconfigurable radiation pattern by reconfiguring a radiation current pattern within said plurality of antenna elements, which is achieved by controlling terminal currents and/or terminal voltages provided by said plurality of independently-controllable RF interface circuits.

6. The antenna of claim 1, wherein said plurality of antenna elements and said plurality of independently-controllable RF interface circuits operate collectively to provide reconfigurable antenna radiation types and/or reconfigurable antenna radiation modes and/or reconfigurable radiation polarization by reconfiguring a radiation current pattern within said plurality of antenna elements, which is achieved by controlling terminal currents and/or terminal voltages provided by said plurality of independently-controllable RF interface circuits.

7. The antenna of claim 1, wherein said plurality of antenna elements and said plurality of independently-controllable RF interface circuits operate collectively to provide antenna power combining by supporting power summing of the terminal currents and/or terminal voltages provided by said plurality of independently-controllable RF interface circuits.

8. The antenna of claim 1, wherein said plurality of antenna elements and said plurality of independently-controllable RF interface circuits operate collectively to provide independent control of the amplitude and/or phase of each of said plurality of antenna elements.

9. The antenna of claim 1, wherein said plurality of antenna elements and said plurality of independently-controllable RF interface circuits operate collectively to provide a plurality of RF signals that are fed by the plurality of independently-controllable RF interface circuits to the plurality of antenna segments to thereby achieve concurrent radiation through the same or different ones of the plurality of antenna segments.

10. The antenna of claim 1, wherein said plurality of antenna elements and said plurality of independently-controllable RF interface circuits operate collectively to provide a plurality of electromagnetic wave signals that are received by the plurality of independently-controllable RF interface circuits, to thereby achieve concurrent signal receiving from the same or different ones of the plurality of antenna segments.

11. The antenna of claim 3, wherein said plurality of RF interface circuits are each configured to selectively activate and control current of the two radiators connected thereto.

12. The antenna of claim 3, wherein said plurality of RF interface circuits are configured to selectively activate any subset of the radiators.

13. An electrically-reconfigurable antenna comprising:
a plurality of antenna elements linked together by a plurality of independently-controllable radio frequency (RF) interface circuits that support impedance (Z) reciprocity during transmit (TX) and receive (RX) modes of operation, wherein the plurality of antenna elements include N+1 antenna elements and the plurality of RF interface circuits include N RF interface circuits, where N is a positive integer greater than one,
wherein a first of the plurality of RF interface circuits is coupled to a first of the plurality of antenna elements and a second of the plurality of antenna elements,
wherein a second of the plurality of RF interface circuits is coupled to the second of the plurality of antenna elements and a third of the plurality of antenna elements,
wherein the first of the plurality of RF interface circuits is coupled to a first end of the second of the plurality of antenna elements and the second of the plurality of RF interface circuits is coupled to a second end of the second of the plurality of antenna elements, and
wherein during the TX mode of operation, the first end of the second of the plurality of antenna elements is electrically connected to a first parallel LC circuit (with variable C) within the first of the plurality of RF interface circuits, but during the RX mode of operation, the first end of the second of the plurality of antenna elements is electrically connected to a second parallel LC circuit (with variable L) within the first of the plurality of RF interface circuits.

14. The antenna of claim 13,
wherein the first of the plurality of RF interface circuits operates as a first RF current feed or voltage driving circuit during the TX mode of operation.

15. The antenna of claim 13, wherein the plurality of independently-controllable RF interface circuits are configured to selectively provide: (i) a particular one of a plurality of transmit driving impedances $Z_{TX}$ during the TX mode; and (ii) a particular one of a plurality of receive termination impedances $Z_{RX}$ during the RX mode.

16. The antenna of claim 15,
wherein $[Z_{RX}]=[Z_{TX}]^*$, $[Z_{TX}]$ designates a set of transmit driving impedances, and $[Z_{RX}]$ designates a set of receive termination impedances.

17. An electrically-reconfigurable antenna comprising:
a plurality of antenna elements linked together by a plurality of independently-controllable radio frequency (RF) interface circuits that support impedance (Z) reciprocity during transmit (TX) and receive (RX) modes of operation,
wherein each of the plurality of RF interface circuits is coupled to two of the plurality of antenna elements,
wherein the plurality of antenna elements include a plurality of rows and a plurality of columns of radiators on a substrate, and
wherein each of the plurality of rows and each of the plurality of columns comprises N+1 radiators that are coupled to N RF interface circuits, and wherein N is a positive integer greater than one.

* * * * *